(12) United States Patent
Choi et al.

(10) Patent No.: US 12,457,874 B2
(45) Date of Patent: *Oct. 28, 2025

(54) DISPLAY DEVICE HAVING AN OPENING BETWEEN PIXELS

(71) Applicant: Samsung Display Co., LTD., Yongin-si (KR)

(72) Inventors: Jun Ho Choi, Asan-si (KR); Chun Gi You, Asan-si (KR); Seong Kweon Heo, Suwon-si (KR); Eun Young You, Suwon-si (KR); Hyun Jin Hong, Gwangmyeong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/597,212

(22) Filed: Mar. 6, 2024

(65) Prior Publication Data

US 2024/0251627 A1 Jul. 25, 2024

Related U.S. Application Data

(63) Continuation of application No. 16/851,937, filed on Apr. 17, 2020, now Pat. No. 11,950,476.

(30) Foreign Application Priority Data

Jul. 16, 2019 (KR) .................. 10-2019-0085965

(51) Int. Cl.
*H10K 59/35* (2023.01)
*H10K 59/122* (2023.01)
(Continued)

(52) U.S. Cl.
CPC ......... *H10K 59/353* (2023.02); *H10K 59/122* (2023.02); *H10K 59/123* (2023.02); *H10K 59/124* (2023.02); *H10K 59/352* (2023.02)

(58) Field of Classification Search
CPC .. H10K 59/353; H10K 59/122; H10K 59/352; H10K 59/124; H10K 59/123
(Continued)

(56) References Cited

U.S. PATENT DOCUMENTS 9,190,627 B2 11/2015 Park et al.
10,347,702 B2 7/2019 Youn et al.
(Continued)

FOREIGN PATENT DOCUMENTS

| CN | 104218065 | 12/2014 |
| CN | 106981580 | 7/2017 |

(Continued)

OTHER PUBLICATIONS

Korean Office Action for Korean Patent Application or Patent No. 10-2019-0085965, dated Oct. 4, 2024.
(Continued)

*Primary Examiner* — Xia L Cross
(74) *Attorney, Agent, or Firm* — Innovation Counsel LLP

(57) ABSTRACT

A display device includes a substrate; a transistor disposed on the substrate; a first insulating layer disposed on the transistor; and a first pixel electrode and a second pixel electrode disposed on the first insulating layer to be adjacent to each other. The first insulating layer includes a first opening between the first pixel electrode and the second pixel electrode.

20 Claims, 14 Drawing Sheets

(51) Int. Cl.
  *H10K 59/123* (2023.01)
  *H10K 59/124* (2023.01)
(58) Field of Classification Search
  USPC .......................................................... 257/40
  See application file for complete search history.

(56) References Cited

U.S. PATENT DOCUMENTS

| | | | |
|---|---|---|---|
| 11,211,582 | B2 | 12/2021 | Kim et al. |
| 2014/0346452 | A1 | 11/2014 | You et al. |
| 2016/0300902 | A1* | 10/2016 | You .................. H10K 59/126 |
| 2017/0117349 | A1* | 4/2017 | Jeon .................. H10K 50/828 |
| 2017/0155078 | A1 | 6/2017 | Lee |
| 2017/0271421 | A1 | 9/2017 | Jinbo et al. |
| 2018/0034000 | A1 | 2/2018 | Lee et al. |
| 2018/0212007 | A1* | 7/2018 | Lee .................. H10K 59/131 |
| 2022/0123262 | A1 | 4/2022 | Kim et al. |

FOREIGN PATENT DOCUMENTS

| | | |
|---|---|---|
| CN | 108780617 | 11/2018 |
| CN | 109273620 | 1/2019 |
| KR | 10-0841368 | 6/2008 |
| KR | 10-2010-0012287 | 2/2010 |
| KR | 10-2016-0013460 | 2/2016 |
| KR | 10-2016-0038552 | 4/2016 |
| KR | 10-2016-0054867 | 5/2016 |
| KR | 10-2016-0149599 | 12/2016 |
| KR | 10-2017-0064126 | 6/2017 |
| KR | 10-1811027 | 12/2017 |
| KR | 10-2018-0129097 | 12/2018 |

OTHER PUBLICATIONS

Chinese Office Action for Chinese Patent Application or Patent No. 202010686799.X, dated Sep. 13, 2024.

* cited by examiner

DISPLAY DEVICE HAVING AN OPENING BETWEEN PIXELS

CROSS-REFERENCE TO RELATED APPLICATION

This is a continuation application of U.S. patent application Ser. No. 16/851,937 filed Apr. 17, 2020, now U.S. Pat. No. 11,950,476, which issued on Apr. 2, 2024, the disclosure of which is incorporated herein by reference in its entirety. U.S. patent application Ser. No. 16/851,937 claims priority to and benefits of Korean Patent Application No. 10-2019-0085965 under 35 U.S.C. § 119, filed in the Korean Intellectual Property Office on Jul. 16, 2019, the entire contents of which are incorporated herein by reference.

BACKGROUND

(a) Technical Field

This disclosure relates to a display device enabling reduced opportunity for pixel shrinkage thereof.

(b) Description of the Related Art

An emissive display device may include light emitting diodes (LEDs) corresponding to pixels, and may display an image by controlling luminance of each of the light emitting diodes. Unlike a light-receiving type of display device such as a liquid crystal display, the emissive display device may not require a separate light source so as to reduce thickness and weight thereof. The emissive display device exhibits characteristics such as high luminance, high contrast ratio, high color reproduction, high response speed, and the like, to display a high quality image.

Thus, the emissive display device may be applied to various electronic devices including mobile devices such as smart phones and tablets, monitors, televisions, and the like, and may also be adapted for use as a display device for vehicles.

The above information disclosed in this background section is only for enhancement of understanding of the background of the disclosure and therefore it may contain information that does not form the prior art that may already be known to a person of ordinary skill in the art.

SUMMARY

Embodiments provide a display device with improved reliability via reduced opportunity for pixel shrinkage thereof.

An embodiment may include a substrate; a transistor disposed on the substrate; a first insulating layer disposed on the transistor; and a first pixel electrode and a second pixel electrode disposed on the first insulating layer to be adjacent to each other. The first insulating layer may include a first opening disposed between the first pixel electrode and the second pixel electrode.

The first pixel electrode may not overlap the first opening, and the second pixel electrode may not overlap the first opening.

The first insulating layer may include a contact hole overlapping a source electrode or a drain electrode of the transistor, and the first opening may be spaced apart from the contact hole.

The first insulating layer may include an organic insulating material.

The first opening may be around a periphery of at least one of the first pixel electrode and the second pixel electrode.

The display device may include a third pixel electrode disposed on the first insulating layer to be adjacent to the first pixel electrode and the second pixel electrode. The first opening may be disposed outside of an area between the first pixel electrode and the third pixel electrode.

The first insulating layer may be disposed continuously on the first pixel electrode and the third pixel electrode, in a plan view.

The display device may include a second insulating layer disposed between the transistor and the first insulating layer, and the second insulating layer may include a portion overlapping the first opening.

The display device may include a third insulating layer disposed on the first insulating layer, and the third insulating layer may include a second opening that overlaps the first pixel electrode and the second pixel electrode.

The third insulating layer may include a portion that may contact the second insulating layer.

The third insulating layer may have a groove overlapping the first opening.

The third insulating layer may have a third opening overlapping the first opening.

The display device may include a first emission member disposed on the first pixel electrode, a second emission member disposed on the second pixel electrode, and a common electrode disposed on the first and second light emitting members. The common electrode may include a portion that may contact the second insulating layer through the second opening.

An embodiment may include a substrate; a transistor disposed on the substrate; a first insulating layer disposed on the transistor; and a first light emitting diode (LED) and a second light emitting diode (LED) disposed on the first insulating layer to be adjacent to each other.

The first insulating layer may include an opening disposed between a first emission member of the first light emitting diode and a second emission member of the second light emitting diode.

The display device may include a second insulating layer disposed between the transistor and the first insulating layer, and the second insulating layer may include a portion overlapping the opening.

The first insulating layer and the second insulating layer may each include a contact hole overlapping a source electrode or a drain electrode of the transistor, and the opening may be spaced apart from the contact holes.

The first light emitting diode may include a first electrode disposed on the first insulating layer, and a second electrode disposed on the first emission member. The first electrode may be connected to the source electrode or the drain electrode through the contact holes.

The first electrode may not overlap the opening.

The opening may be around a periphery of the first electrode.

The display device may include a third light emitting diode disposed on the first insulating layer to be adjacent to the first light emitting diode and the second light emitting diode, and that may include a third emission member. The opening may be disposed outside of an area between the first emission member and the third emission member.

The first insulating layer be disposed continuously on the first emission member and the third emission member, in a plan view.

The display device may include a third insulating layer disposed on the first insulating layer. The third insulating layer may include a portion that may be in contact with the second insulating layer.

The third insulating layer may include a groove or an opening, and the groove or the opening may overlap the opening of the first insulating layer.

According to embodiments, it may possible to provide a display device with improved reliability. In particular, it may be possible to prevent pixels from being damaged or the light emitting area thereof from being reduced due to outgassing that may occur in an insulating layer including an organic insulating material of the display device.

DETAILED DESCRIPTION OF THE EMBODIMENTS

Figure 1:
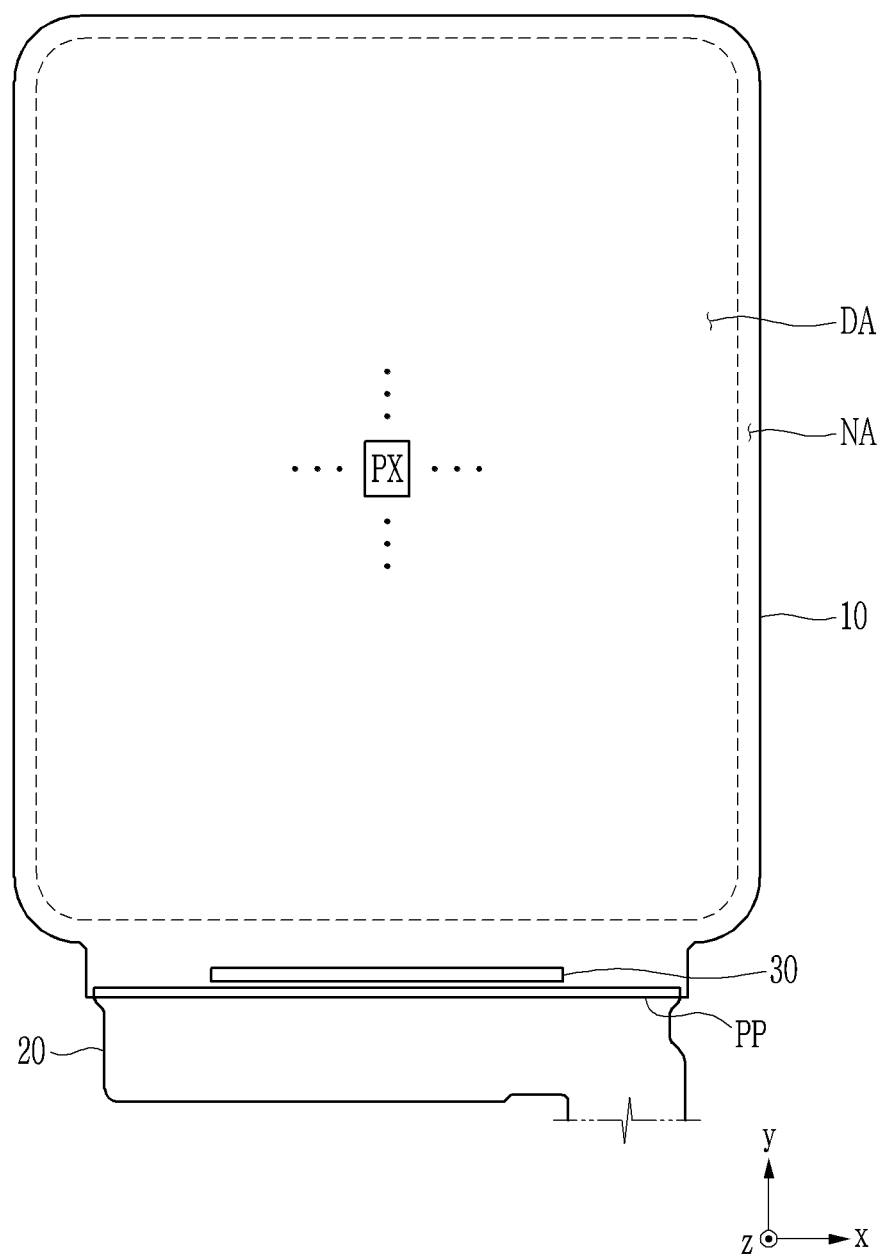
FIG. 1 illustrates a top plan view of a display device according to an embodiment.

The disclosure will be described more fully hereinafter with reference to the accompanying drawings, in which embodiments are shown. As those skilled in the art may realize, the described embodiments may be modified in various ways, without departing from the spirit or scope of the embodiments described herein.

To clearly describe the inventive concept, parts that are irrelevant to the description may be omitted, and like numerals refer to like or similar constituent elements throughout the disclosure.

Further, since sizes and thicknesses of constituent members shown in the accompanying drawings may be arbitrarily given for better understanding and ease of description, embodiments may not be limited to the illustrated sizes and thicknesses. In the drawings, the thicknesses of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" an element, it may be directly on the element or intervening element(s) may be present therebetween. In contrast, when an element is referred to as being "directly on" an element, there may be no intervening element therebetween. The word "over" or "on" means positioning on or below an object portion, and does not necessarily mean positioning on the upper side of the object portion based on a gravity direction.

Unless explicitly described to the contrary, the word "comprise" and variations such as "comprises" or "comprising" will be understood to imply the inclusion of stated elements but not the exclusion of any other elements. As used herein, the term "and/or" may include any and all combinations of one or more of the associated listed items. Expressions such as "at least one of," when preceding a list of elements, modify the entire list of elements and do not modify the individual elements of the list.

In the drawings, a reference character x used for indicating a direction may indicate a first direction, y may be a second direction perpendicular to the first direction, and z may be a third direction perpendicular to the first direction and the second direction. The first direction x, the second direction y, and the third direction z may correspond to a horizontal direction, a vertical direction, and a thickness direction of the display device, respectively.

In a case that a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

FIG. 1 illustrates a top plan view of a display device according to an embodiment.

Referring to FIG. 1, the display device may include a display panel 10, a flexible printed circuit film 20 bonded to the display panel 10, and a driving unit including an integrated circuit chip 30.

The display panel 10 may include a display area DA corresponding to a screen on which an image may be displayed and a non-display area NA. Circuits and/or signal lines for generating and/or transferring various signals and voltages applied to the display area DA may be disposed in the non-display area NA. The non-display area NA may surround or be around a periphery of the display area DA. In FIG. 1, the inside and outside of a dotted-line quadrangle correspond to the display area DA and the non-display area NA, respectively.

Pixels PX may be disposed in a matrix form in the display area DA of the display panel 10. Signal lines such as a gate line (also referred to as a scan line), a data line, and a driving voltage line may also be disposed in the display area DA. Each of the pixels PX may be connected with the gate line, the data line, the driving voltage line, to receive a gate signal (also referred to as a scan signal), a data signal, a driving voltage ELVDD.

A touch sensor for detecting a user's touch and/or a non-contact touch may be disposed in the display area DA. Although the display area DA may have a substantially rectangular shape, as is illustrated, the display area DA may have various shapes such as a polygonal shape, a circular shape, an elliptical shape, and the like.

A pad portion PP in which pads for receiving signals from the outside of the display panel 10 may be disposed in the non-display area NA of the display panel 10. The pad portion PP may be disposed to extend in a first direction x along one edge of the display panel 10. A flexible printed circuit film 20 may be bonded to the pad portion PP, and pads of the flexible printed circuit film 20 may be electrically connected to pads of the pad portion PP.

The driving unit may be disposed in the non-display area NA of the display panel 10 to generate and/or process various signals for driving the display panel 10. The driving unit may include a data driver for applying a data signal to the data line, a gate driver for applying a gate signal to the gate line, and a signal controller for controlling the data driver and the gate driver. The pixels PX may receive the data signal at predetermined timing depending on the gate signal generated by the gate driver. The gate driver may be integrated in the display panel 10, and may be disposed on at least one side of the display area DA. The data driver and the signal controller may be provided as an integrated circuit chip (also referred to as a driving IC chip) 30. The integrated circuit chip 30 may be mounted in the non-display area NA of the display panel 10. The integrated circuit chip 30 may be mounted on the flexible printed circuit film 20 or the like to be electrically connected to the display panel 10.

A description of a display device according to an embodiment follows below with reference to FIG. 2 to FIG. 4, based on the display area DA.

Figure 2:
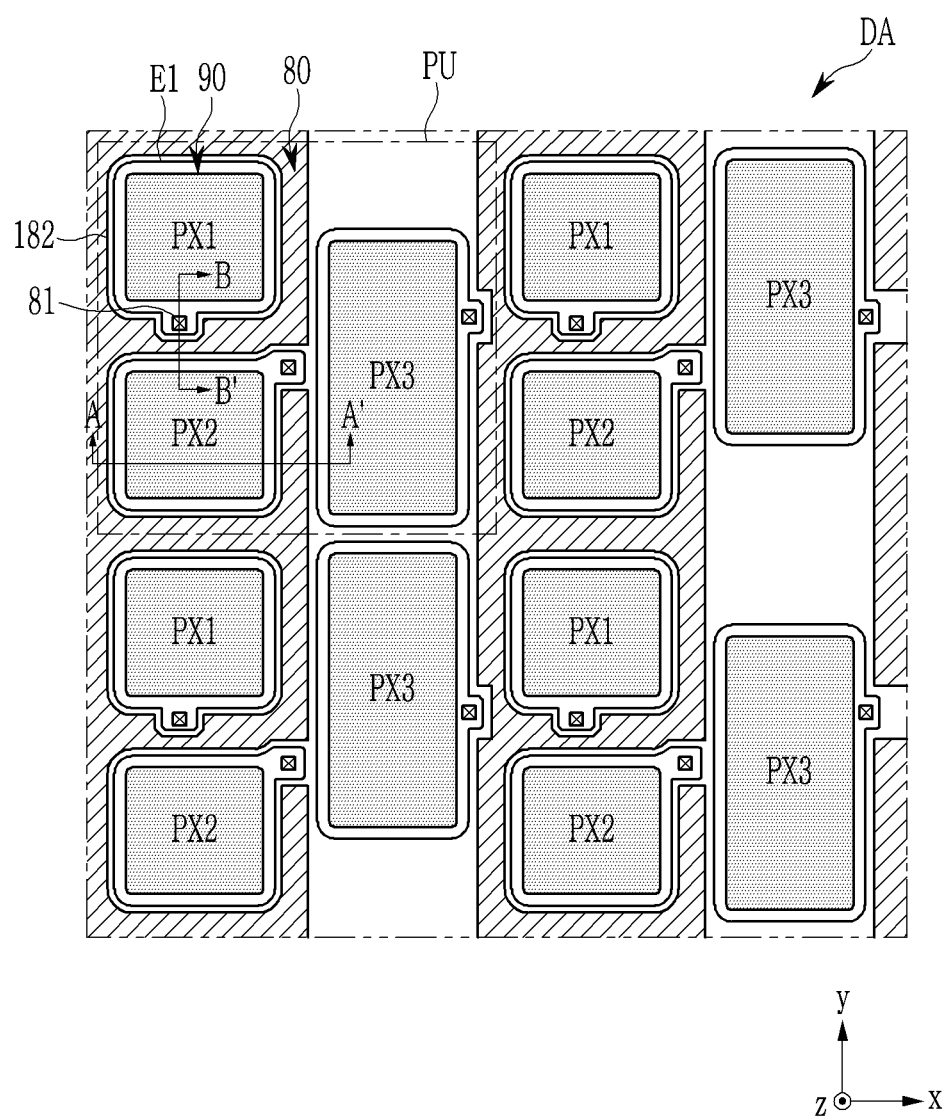
FIG. 2 illustrates a top plan view of a display area of a display device according to an embodiment.
Figure 3:
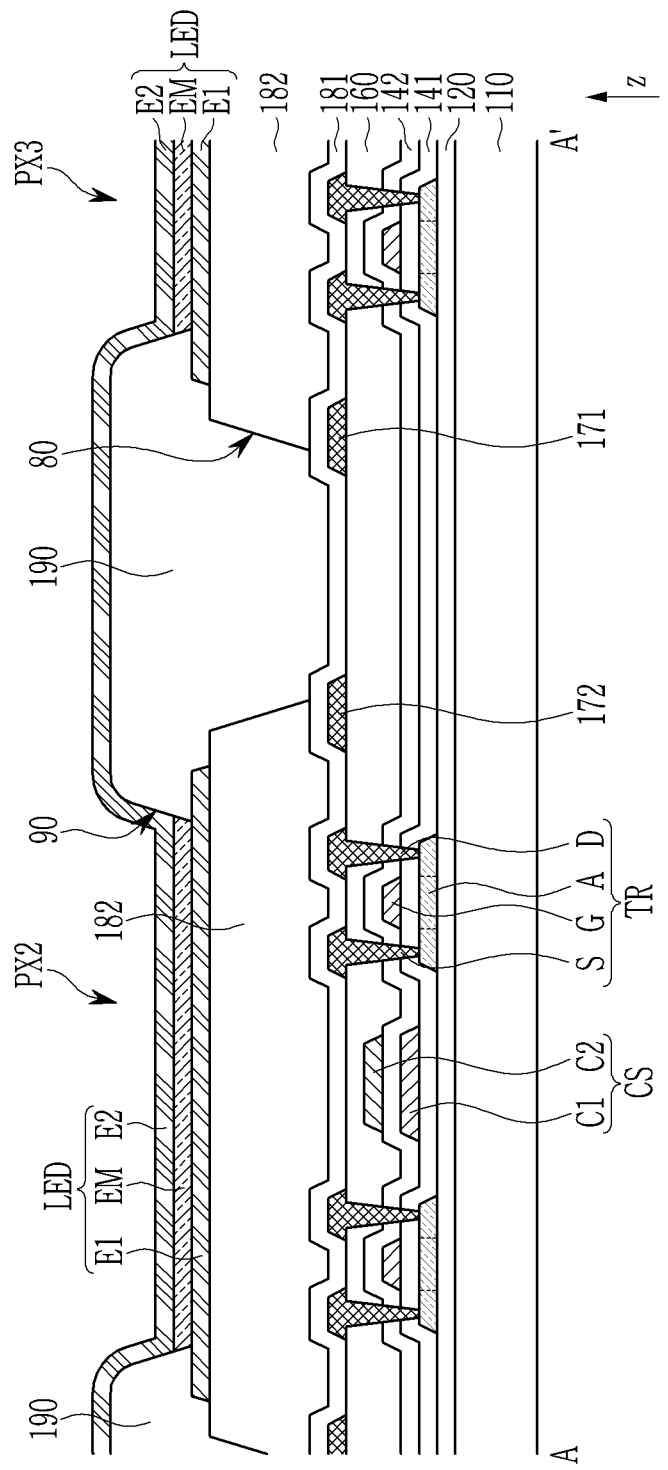
FIG. 3 illustrates a schematic cross-sectional view taken along line A-A' of FIG. 2.
Figure 4:
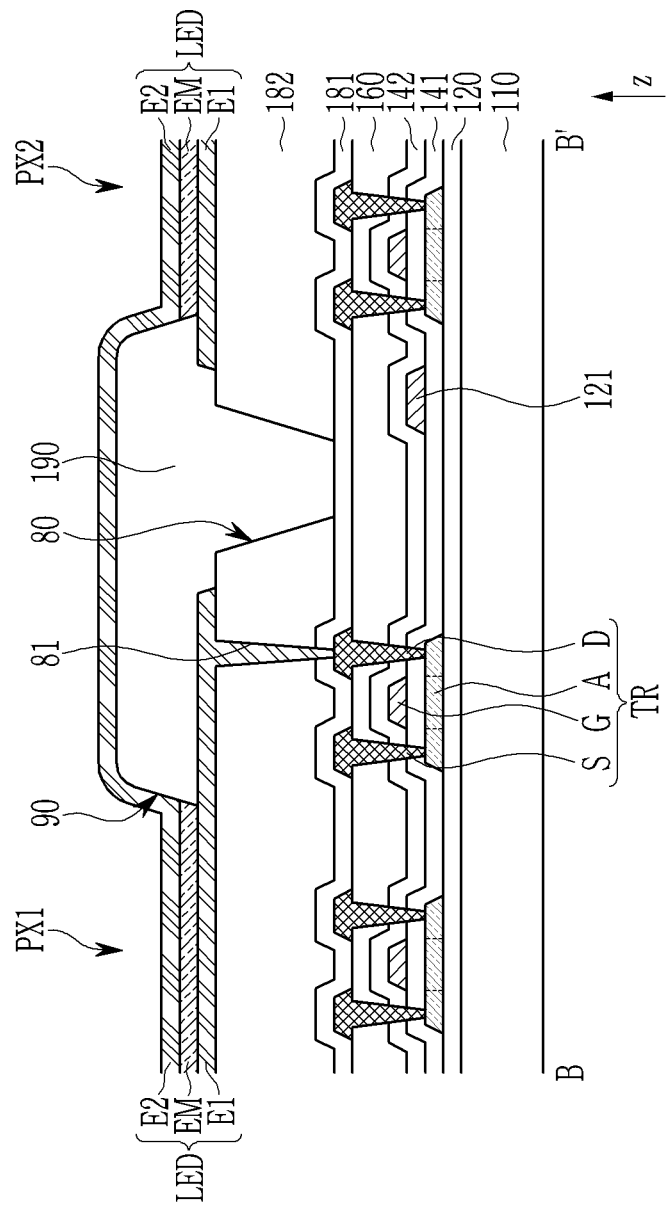
FIG. 4 illustrates a schematic cross-sectional view taken along line B-B' of FIG. 2.

FIG. 2 illustrates a top plan view of a display area of a display device according to an embodiment, FIG. 3 illustrates a schematic cross-sectional view taken along line A-A' of FIG. 2, and FIG. 4 illustrates a schematic cross-sectional view taken along line B-B' of FIG. 2.

Referring to FIG. 2, a display area DA in which, for example, approximately 12 pixels PX1, PX2, and PX3 are disposed is illustrated. In the display area DA illustrated in FIG. 2, the pixels PX1, PX2, and PX3 may be repeatedly disposed in a first direction x and a second direction y. Three adjacent pixels PX1, PX2, and PX3 may display different primary colors. The three pixels PX1, PX2, and PX3 may constitute one pixel unit PU. The primary colors may be red, green, and blue. Each of the pixels PX1, PX2, and PX3 may display one color, i.e., red, green, or blue. For example, the pixel PX1 may be a red pixel, the pixel PX2 may be a green pixel, and the pixel PX3 may be a blue pixel. The pixel unit PU may be repeatedly disposed in a matrix form in the display area DA.

The pixel unit PU may include more than three pixels in other embodiments. The pixel unit PU may include a pixel capable of displaying a color that may be different from any of those of the three pixels PX1, PX2, and PX3. The pixel unit PU may include a pixel capable of displaying a same or similar color to any one of the three pixels PX1, PX2, and PX3. The pixel unit PU may not include any one of three pixels PX1, PX2, and PX3.

Each of the pixels PX1, PX2, PX3 may be referred to as a subpixel and the pixel unit PU may be referred to as a pixel. Below, a description of the pixel and the pixel unit PU follows in regard to the referenced figures.

Referring to FIG. 2 to FIG. 4, the display panel 10 may include several layers, wires, and devices that may be stacked on the substrate 110 to configure and drive the pixels PX1, PX2, and PX3.

The substrate 110 may include an insulating material such as glass or plastic. The substrate 110 may include at least one barrier layer for preventing penetration of moisture, etc., from the outside. The barrier layer may be an inorganic insulating material such as a silicon oxide $SiO_x$ and a silicon nitride $SiN_x$.

A buffer layer 120 may be disposed on the substrate 110. The buffer layer 120 may block impurities that may diffuse from the substrate 110 to a semiconductor layer A, and reduce stress that may be applied to the substrate 110 during formation of the semiconductor layer A. The buffer layer 120 may include an inorganic insulating material such as a silicon oxide ($SiO_x$), a silicon nitride ($SiN_x$), and the like.

A semiconductor layer A of a transistor TR may be disposed on the buffer layer 120. The semiconductor layer A may include a channel region that may overlap or face a gate electrode G of the transistor TR, and a source region and a drain region positioned at opposite sides of the channel region. The semiconductor layer A may include polysilicon, amorphous silicon, or an oxide semiconductor.

An insulating layer 141 may be disposed on the semiconductor layer A. The insulating layer 141 may be referred to as a first gate insulating layer. The insulating layer 141 may include an inorganic insulating material such as a silicon oxide ($SiO_x$), a silicon nitride ($SiN_x$), and the like.

A first gate conductor that may include a gate line 121, the gate electrode G, and a first electrode C1 of a capacitor CS may be disposed on the insulating layer 141.

Another insulating layer 142 may be disposed on the insulating layer 141 and the first gate conductor. The insulating layer 142 may be referred to as a second gate insulating layer. The insulating layer 142 may include an inorganic insulating material such as a silicon oxide ($SiO_x$), a silicon nitride ($SiN_x$), and the like.

A second gate conductor may include a second electrode C2 of the capacitor CS disposed on the insulating layer 142. The first gate conductor and/or the second gate conductor may include a metal such as molybdenum (Mo), copper (Cu), aluminum (Al), silver (Ag), chromium (Cr), tantalum (Ta), or titanium (Ti), or a metal alloy thereof. The first gate conductor and/or the second gate conductor may include single or multiple layers.

Another insulating layer 160 may be disposed on the insulating layer 142 and the second gate conductor. The insulating layer 160 may be referred to as an interlayer insulating layer. The insulating layer 160 may include an inorganic insulating material such as a silicon oxide ($SiO_x$), a silicon nitride ($SiN_x$), and the like.

A data conductor, which may include a data line 171, a driving voltage line 172, and a source electrode S and a drain electrode D of the transistor TR, may be disposed on the insulating layer 160. The source electrode S and the drain electrode D may be connected to a source region and a drain region of the semiconductor layer A through contact holes formed in the insulating layers 141, 142, and 160, respectively. The data conductor may include aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like. The data conductor may include a single layer or multiple layers.

The transistor TR may include the gate electrode G, the source electrode S, the drain electrode D, and the semiconductor layer A. The gate electrode G may form a control terminal of the transistor TR, one of the source electrode S and the drain electrode D may form an input terminal, and the other of the source electrode S and the drain electrode D may form an output terminal. The transistor TR may be a top-gate transistor since the gate electrode G may be disposed above the semiconductor layer A. The transistor TR may be a bottom-gate transistor in which the gate electrode G may be disposed below the semiconductor. The transistor TR may be a vertical transistor in which the source electrode and the drain electrode may overlap or face each other.

Another insulating layer 181 may be disposed on the insulating layer 160 and the data conductor. The insulating layer 181 may be referred to as a passivation layer. The insulating layer 181 may include an inorganic insulating material such as a silicon oxide ($SiO_x$), a silicon nitride ($SiN_x$), and the like.

Another insulating layer 182 may be disposed on the insulating layer 181. The insulating layer 182 may be referred to as a planarization layer. The insulating layer 182 may planarize a surface on which the light emitting diodes LED may be formed, in order to increase light emission efficiency of the light emitting diodes LED. The insulating layer 182 may include an organic insulating material such as a polyimide, an acryl-based polymer, or a siloxane-based polymer.

The insulating layer 182 may include an opening 80 between adjacent pixels PX1, PX2, and PX3. The opening 80 may be an area where a portion of the insulating layer 182 may be removed, and may correspond to a hatched area as shown in FIG. 2. The opening 80 may be formed in a region of the insulating layer 182 that may not overlap or be offset from the pixels PX1, PX2, and PX3. The opening 80 may not overlap or be offset from a first electrode E1 or an emission member EM of a light emitting diode LED. For example, the opening 80 may be positioned at least about 1 µm away from the emission member EM. The opening 80 may be formed to completely surround or be around peripheral portions of at least one pixel PX1 in the pixel unit PU. For example, the opening 80 may completely surround or be around peripheral portions of each of the emission member EM and a first electrode E1 that may be included in the pixel PX1.

The insulating layer 182 may be formed via coating and curing of a polymer solution including a material such as a solvent, an initiator, a binder, and the like. It may be the case that once the insulating layer 182 is formed, material of the insulating layer 182, e.g., decomposed material of the insulating layer 182 may be discharged as a gas during remaining manufacture of the display device and/or during use of the display device. This phenomenon may be referred to as outgassing. The discharged gas may propagate to the pixels PX1, PX2, and PX3. The propagation may cause shrinkage that reduces light emitting regions of the pixels PX1, PX2, and PX3 by denaturing or deteriorating a second electrode E2 and/or the emission member EM of the pixels PX1, PX2, and PX3. The gas may escape through the opening 80 without propagating to the pixels PX1, PX2, and PX3 as a result of providing the opening 80. Since the gas may be smoothly discharged through the opening 80 once the insulating layer 182 may be formed, an amount of shrinkage of the light emitting regions that may be caused by the outgassing may be suppressed. Since an area and/or a volume of the insulating layer 182 may be reduced based on formation of the opening 80, the outgassing of the insulating layer 182 itself may be reduced.

The insulating layer 181 between the data conductor and the insulating layer 182 may prevent the data conductor from being exposed through the opening 80 of the insulating layer 182. Thus, the data conductor may be prevented from being damaged or short-circuited relative to another conductor.

The first electrode E1 of the light emitting diode LED may be disposed on the insulating layer 182. The first electrode E1 may be a pixel electrode. The first electrode E1 may be connected to a source electrode S or a drain electrode D through contact holes 81 formed in the insulating layers 181 and 182. The contact hole 81 may be positioned away from the opening 80 of the insulating layer 182. The opening 80 of the insulating layer 182 and the contact hole 81 may be formed together through a same process or at the same time. For example, the opening 80 and the contact hole 81 may be formed together in the insulating layer 182 through a photolithography process using one mask. Accordingly, separate formation of the opening 80 and the contact hole 81 may be avoided. However, since the contact hole 81 also extends through the insulating layer 181, photolithography for forming the contact hole 81 in the insulating layer 181 may be required. The first electrode E1 may include a portion overlapping or facing the contact hole 81, while not overlapping the opening 80. In other words, the first electrode E1 may be offset from the opening 80 so as to not be aligned with the opening 80.

The transistor TR to which the first electrode E1 may be connected may be a driving transistor, or the transistor TR may be a light emission control transistor that may be electrically connected to the driving transistor. The first electrode E1 may include a metal such as silver (Ag), nickel (Ni), gold (Au), platinum (Pt), aluminum (Al), copper (Cu), aluminum neodymium (AlNd), aluminum nickel lanthanum (AlNiLa), and a metal alloy. The first electrode E1 may include a transparent conductive material such as an indium tin oxide (ITO) or an indium zinc oxide (IZO).

Another insulating layer 190 having an opening 90 overlapping or facing the first electrode E1 may be disposed on the insulating layer 182. The opening 90 of the insulating layer 190 may define a region corresponding to the light emitting region of each of the pixels PX1, PX2, and PX3. The insulating layer 190 may be referred to as a pixel definition layer. In FIG. 2, a gray shaded region may correspond to the opening 90 where the insulating layer 190 may be removed. The insulating layer 190 may include an organic insulating material such as a polyimide, a polyacrylate, and a polyamide. The insulating layer 190 may include a portion that contacts the insulating layer 181 via the opening 80 of the insulating layer 182.

The emission member EM may be disposed on the first electrode E1. The emission member EM may include a first organic common layer, an emission layer, and a second organic common layer, which may be sequentially stacked. The first organic common layer may include at least one of a hole injection layer and a hole transport layer. The emission layer may include an organic material that uniquely emits light of a primary color such as red, green, and blue. The emission layer may have a structure in which organic material layers emitting the light of different colors may be stacked. The emission layer may be a blue emission layer that emits blue light. The display device may include a color conversion layer and/or a color filter overlapping or facing the emission layer. The first organic common layer may include at least one of an electron transport layer and an electron injection layer.

The second electrode E2 may be disposed on the emission member EM. The second electrode E2 may be disposed over several pixels. The second electrode E2 may be referred to as a common electrode with respect to the pixels. The second electrode E2 may be electrically connected to a common voltage line which may transfer the common voltage (ELVSS). The second electrode E2 may include a low work function metal such as calcium (Ca), barium (Ba), magnesium (Mg), aluminum (Al), or a thin layer of silver (Ag) enabling light transmittance. The second electrode E2 may include a transparent conductive material such as ITO or IZO.

The first electrode E1, the emission member EM, and the second electrode E2 of each of the pixels PX1, PX2, and PX3 may form a light emitting diode LED, which may be an organic light emitting diode (OLED). Each of the pixels PX1, PX2, and PX3 may include a corresponding light emitting diode LED. The first electrode E1 may be an anode which is a hole injection electrode and the second electrode E2 may be a cathode which is an electron injection electrode, or vice versa. In a case that holes and electrons may be injected from the first electrode E1 and the second electrode E2 into the emission member EM, excitons formed by combining the injected holes and electrons may be emitted when they convert from an excited state to a ground state.

An encapsulation layer may be disposed on the second electrode E2. The encapsulation layer may encapsulate the light emitting diode LED to prevent moisture or oxygen from penetrating from the outside of the display device. The encapsulation layer may be stacked on the second electrode E2 or provided as a substrate.

Figure 5:
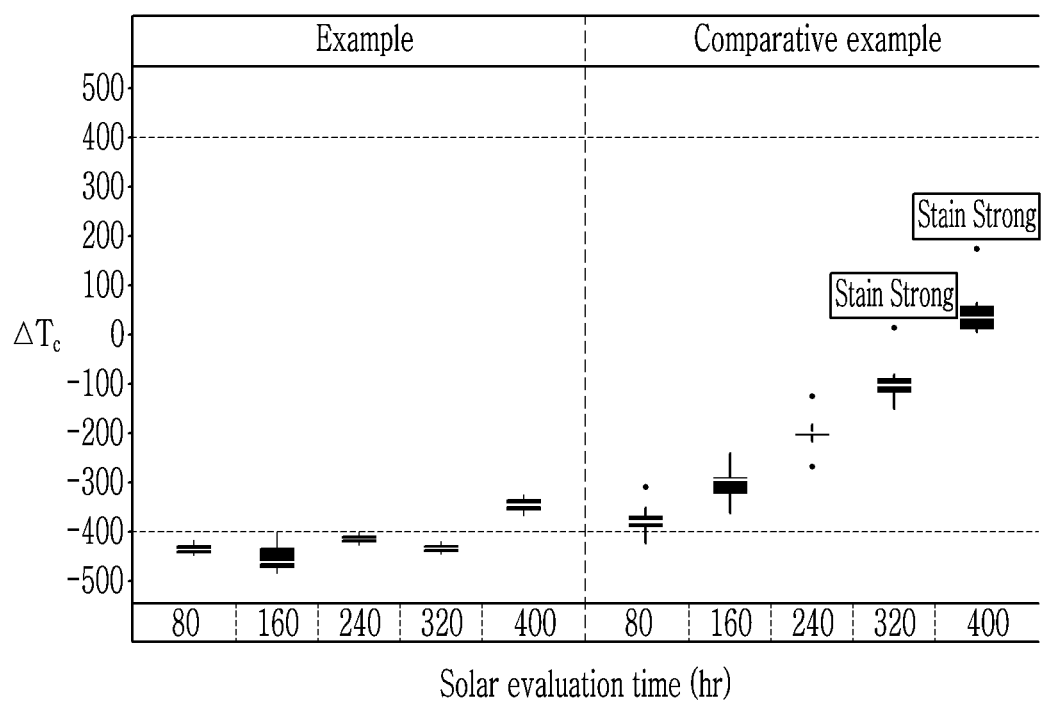
FIG. 5 illustrates a graph showing color changes of a display device according to an embodiment and a display device according to a comparative example.

As mentioned, outgassing of the insulating layer 182 may occur not only during manufacture of the display device but also during use after manufacture of the display device. In a case that the display device may be exposed to external light, such as sunlight, for a long period of time, as may occur in a vehicle, decomposed products may be discharged as a gas due to ultraviolet exposure. Referring to FIG. 5, in the case of a display device according to a comparative example in which an opening is not formed in the insulating layer 182, reliability of the display device with respect to shrinkage of light emitting regions of pixels was ensured up to about 280 hours during an evaluation of exposure to ultraviolet rays at a high temperature (about 85° C.), and stains appeared strongly on the screen after about 320 hours. However, according to an embodiment herein, the display device having the opening 80 formed in the insulating layer 182 had a color change ($\Delta T_c$) which was determined to be at an acceptable level, even when exposed to ultraviolet rays for about 400 hours under the same conditions as in the comparative example, and no stains appeared on the screen. Therefore, according to the embodiment, it may be seen that damage (particularly shrinkage) of the pixels due to outgassing of the insulating layer 182 may be prevented. Accordingly, the display device according to the embodiment may significantly improve reliability, and particularly solar reliability relative to an amount of shrinkage resulting from ultraviolet exposure.

Based on one pixel unit PU, the opening 80 of the insulating layer 182 may be formed differently from that which is illustrated in FIG. 2.

Figure 6:
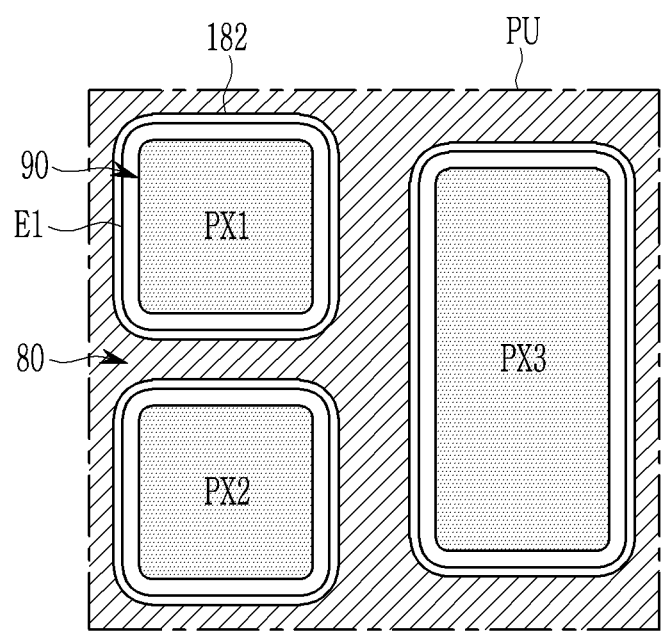
FIG. 6 to FIG. 10 respectively illustrate top plan views of display areas of display devices according to embodiments.

FIGS. 6- through 10 each illustrates a top plan view of a display area of a display device according to an embodiment. In each figure, a hatched area corresponds to the opening 80 of the insulating layer 182.

Referring to FIG. 6, the opening 80 of the insulating layer 182 may be formed to surround or be around peripheries each of the pixels PX1, PX2, and PX3. Thus, each of the pixels PX1, PX2, and PX3 may be divided or separated from each other by the opening 80. The first electrode E1 of each of the pixels PX1, PX2, and PX3 may also be surrounded by the opening 80. In other words, the opening 80 may surround or be around a periphery of the first electrode E1 of each of the pixels PX1, PX2, and PX3. As described above, the opening 80 may be formed by removing the insulating layer 182 in regions thereof not overlapping the first electrode E1 so as to be offset from the first electrode E1, thereby reducing the outgassing of the insulating layer 182 and improving gas discharge. In a case that the insulating layer 181 may be formed below the insulating layer 182 to cover the data conductor, the data conductor may be prevented from being short-circuited relative to another conductor. Otherwise, the data conductor may be damaged in the absence of coverage thereon.

Figure 7:
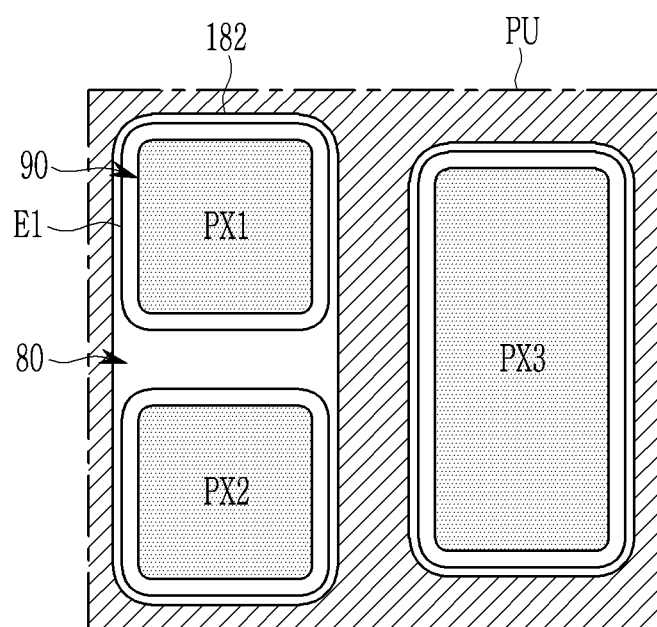

Referring to FIG. 7, the opening 80 of the insulating layer 182 may simultaneously surround or be around peripheries of two pixels PX1 and PX2 and separately surround or be around a periphery of one pixel PX3. For example, the pixels PX1 and PX2 may not be divided or separated based on the opening 80, and the insulating layer 182 may be formed continuously in the pixels PX1 and PX2. The pixel PX3 may be separated from the pixels PX1 and PX2 based on the opening 80.

Figure 8:
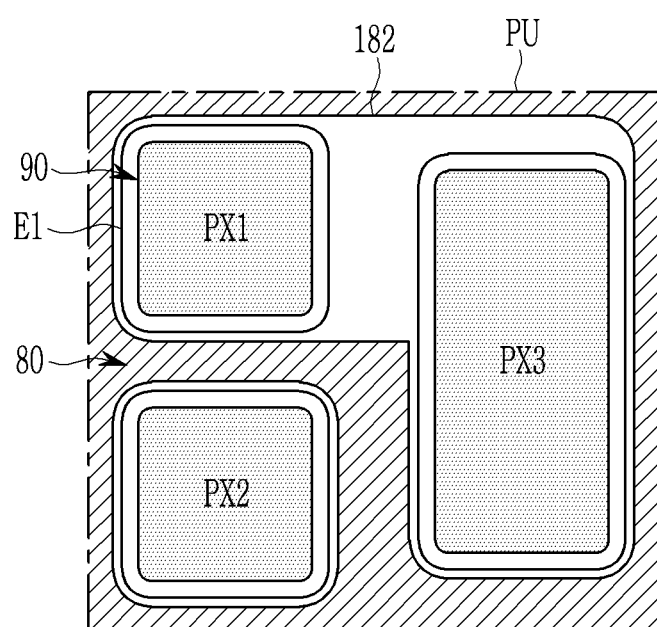

Referring to FIG. 8, the opening 80 of the insulating layer 182 may simultaneously surround or be around peripheries of two pixels PX1 and PX3 and separately surround or be around a periphery of one pixel PX2. For example, the pixels PX1 and PX3 may not be divided or separate based on the opening 80, but the pixel PX2 may be separated from the pixels PX1 and PX3 based on the opening 80. In other words, the opening 80 may be outside an area between the pixels PX1 and PX3, in which the area may include a sub-area along which the pixels PX1 and PX3 overlap or face each other in a plan view. Accordingly, the insulating layer 182 may be formed continuously on the pixels PX1 and PX3.

Figure 9:
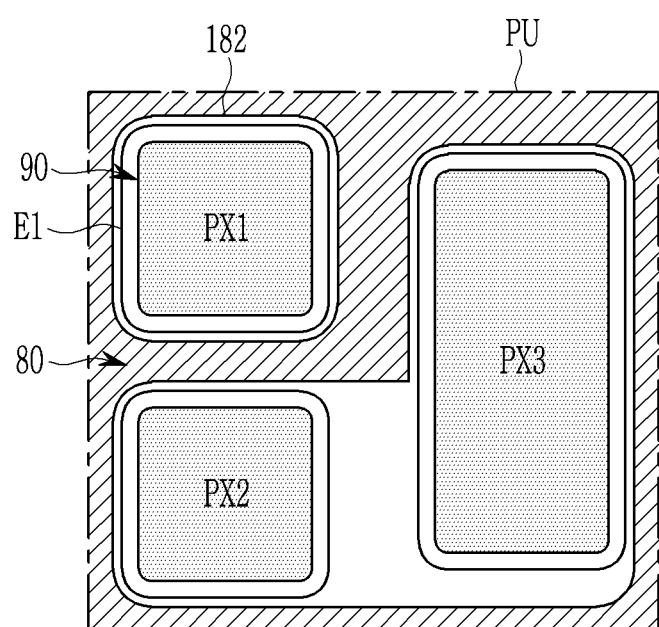

Referring to FIG. 9, the opening 80 of the insulating layer 182 may simultaneously surround or be around peripheries of two pixels PX2 and PX3 and separately surround or be around a periphery of one pixel PX1. The pixels PX2 and PX3 may not be divided or separated based on the opening 80, but the pixel PX1 may be separated from the pixels PX2 and PX3 based on the opening 80. Accordingly, the insulating layer 182 may be formed continuously on the pixels PX2 and PX3.

Figure 10:
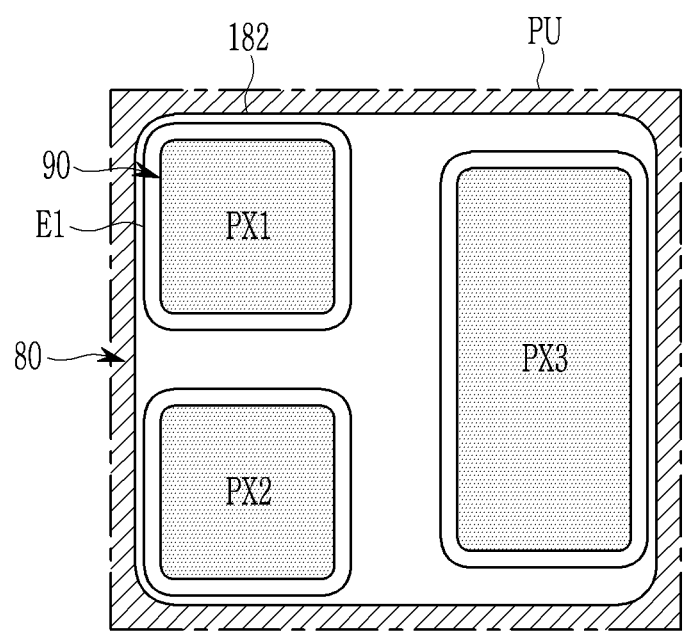

Referring to FIG. 10, the opening 80 of the insulating layer 182 may surround or be around peripheries of all three pixels PX1, PX2, and PX3. Accordingly, the three pixels PX1, PX2, and PX3 may not be divided or separated from each other as a result of the opening 80, though neighboring pixel units PU may be separated from the three pixels PX1, PX2, and PX3 based on the opening 80. Accordingly, the insulating layer 182 may be formed continuously on the pixels PX1, PX2, and PX3.

A region in which the opening 80 may be formed in the insulating layer 182 and defined by the opening 80 may be variously changed depending on pixel design such as the number, arrangement, and shape of pixels included in one pixel unit PU.

Figure 11:
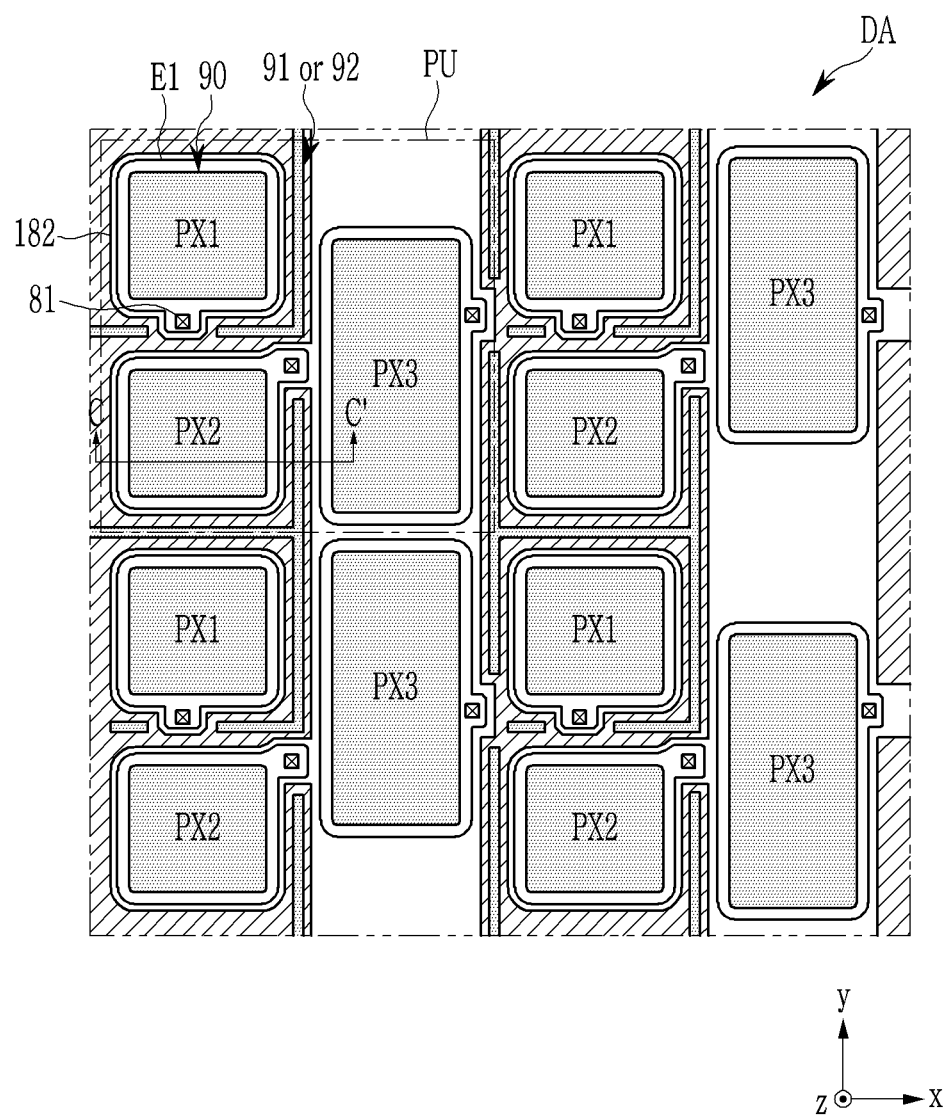
FIG. 11 illustrates a top plan view of a display area according to an embodiment.
Figure 12:
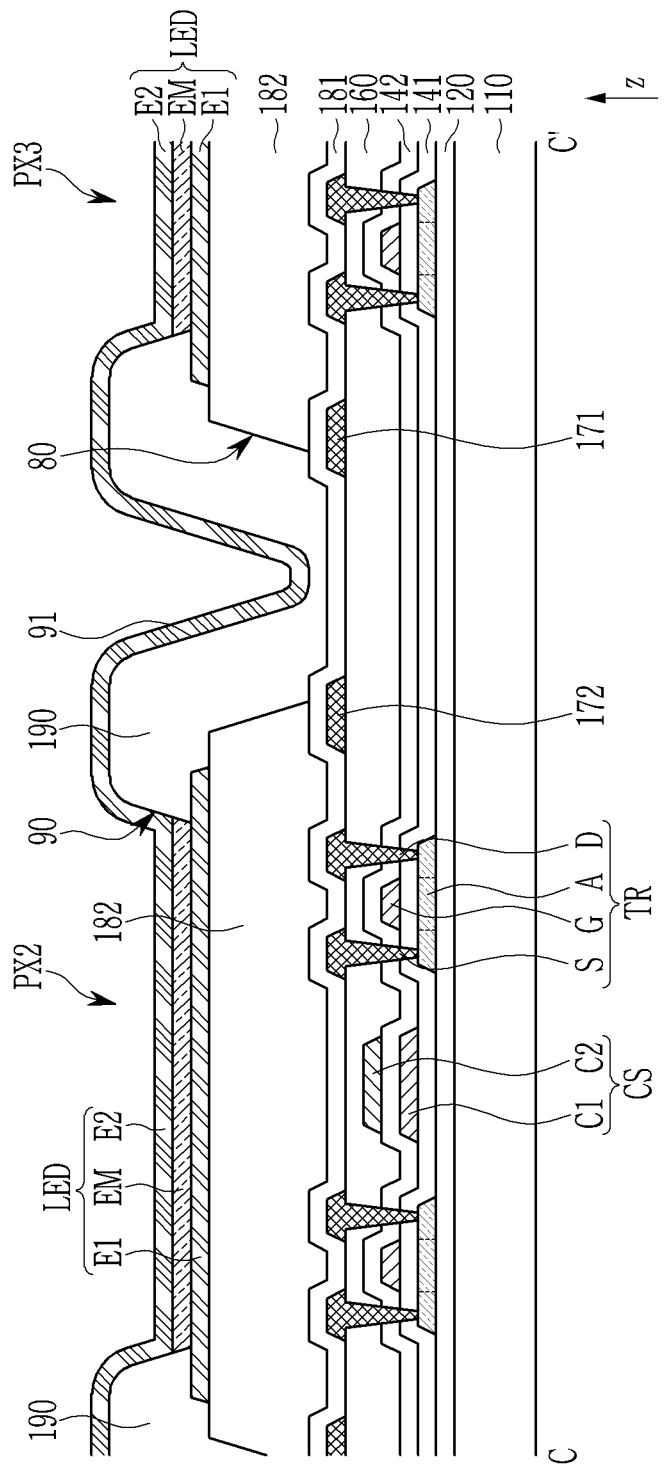
FIG. 12 illustrates a schematic cross-sectional view taken along line C-C' of FIG. 11.
Figure 13:
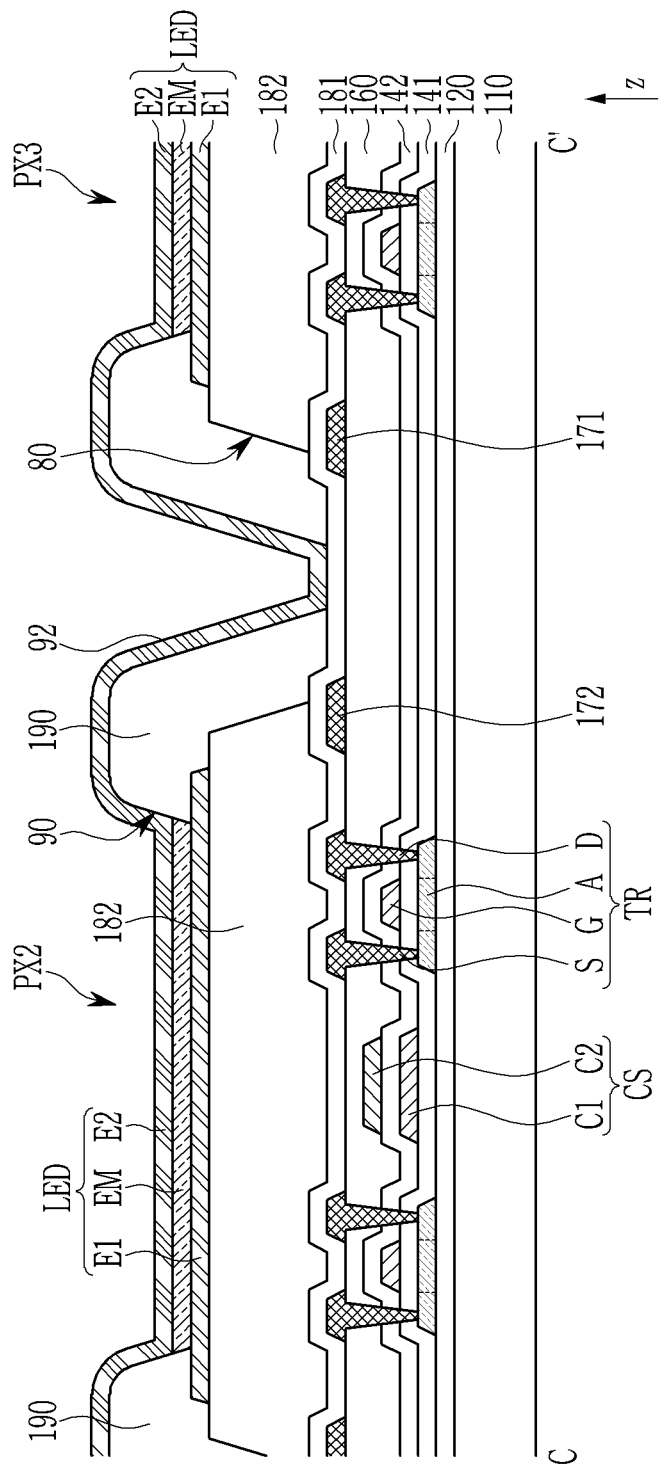
FIG. 13 illustrates a schematic cross-sectional view taken along line C-C' of FIG. 11.

FIG. 11 illustrates a top plan view of a display area according to an embodiment, and FIG. 12 and FIG. 13 each illustrates a schematic cross-sectional view taken along line C-C' of FIG. 11. In FIG. 11, a gray shaded region may define a region where the insulating layer 190 may be removed.

Referring to FIG. 11 and FIG. 12, the display device differs from those of the above-described embodiments with respect to the shape of the insulating layer 190. The insulating layer 190 may include a groove 91, such as a trench, in a region overlapping the opening 80 of the insulating layer 182. The insulating layer 190 may not be completely separated based on the groove 91 so as to include continuous portions thereof on either side of the groove 91. A lower end of the groove 91 may be slightly away from the insulating layer 181. The second electrode E2 may be disposed in or on the groove 91, and may not contact with the insulating layer 181 or the insulating layer 182.

As such, in a case that the grooves 91 may be formed in the insulating layer 190, the gas discharged through the opening 80 of the insulating layer 182 may be prevented from propagating to the pixels PX1, PX2, and PX3 through the insulating layer 190 so as to not be discharged to the outside. Since a volume of the insulating layer 190 may be reduced as a result of formation of the groove 91, outgassing of the insulating layer 190, which may be formed of an organic insulating material, may be reduced.

Referring to FIG. 13, the insulating layer 190 may include an opening 92 in a region overlapping or facing the opening 80 of the insulating layer 182. Unlike the groove 91 illustrated in FIG. 12, the opening 92 may be formed to penetrate the insulating layer 190 completely through a thickness direction of the insulating layer 190. In a plan view, the opening 92 may be positioned within the opening 80. The second electrode E2 may include a portion that contacts the insulating layer 181 based on the opening 92 of the insulating layer 190. Thus, in a case that the opening 92 may be formed in the insulating layer 190, gas that may be discharged through the opening 80 of the insulating layer 182 may be prevented from propagating to the pixels PX1, PX2, and PX3 through the insulating layer 190 as a result of the portion of the second electrode E2 contacting the insulating layer 181. Since a volume of the insulating layer 190 may be reduced based on formation of the opening 92, outgassing of the insulating layer 190, which may be formed of an organic insulating material, may be reduced.

Figure 14:
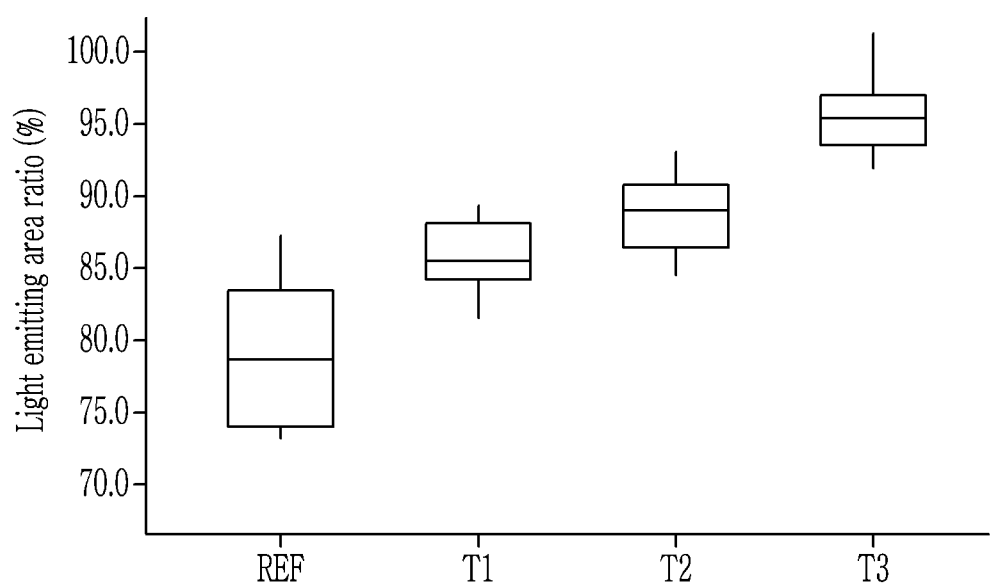
FIG. 14 illustrates a graph showing a result of evaluating a light emitting area ratio depending on a decrease in a thickness of an insulating layer.

FIG. 14 illustrates a graph showing a result of evaluating a light emitting area ratio depending on a decrease in a thickness of an insulating layer.

The graph of FIG. 14 shows how much the emission area of a blue pixel may be reduced in a case that a thickness of the insulating layer 190 and/or the insulating layer 182, which may each include an organic insulating material, may be reduced in the display device according to the embodiment. In the graph, a light emitting area ratio representing no shrinkage may be expressed as 100%.

REF indicates a case where the insulating layer 182, which may be a planarization layer, may be formed to have a thickness of about 2.15 μm and the insulating layer 190, which may be a pixel defining layer, may be formed to have a thickness of about 4.05 μm, and an average of the light emitting area ratio may be about 79%. This shows that shrinkage occurs to reduce the light emitting area by about 21%.

T1 indicates a case where the thickness of the insulating layer 182 may be maintained (to be about 2.15 µm) and the thickness of the insulating layer 190 may be reduced to be about 3.0 µm, and the average of the light emitting area ratio may be about 86%. T2 indicates a case where the thickness of the insulating layer 190 may be maintained (to be about 4.05 µm) and the thickness of the insulating layer 182 may be reduced to be about 1.5 µm, and the average of the light emitting area ratio may be about 89%. Although the insulating layer 190 may be thicker than the insulating layer 182, an opening 90 overlapping or facing the first electrode E1 may be formed in the insulating layer 190. Therefore, a volume reduction caused by the thickness reduction of the insulating layer 182 based on the above-discussed opening 80 and the suppression of outgassing caused thereby may be greater in the insulating layer 182 than in the insulating layer 190. For this reason, the light emitting area ratio resulting from the decrease in the thickness of the insulating layer 182 may be higher than the light emitting area ratio resulting from a decrease in the thickness of the insulating layer 190.

T3 indicates a case where the thickness of the insulating layer 190 may be reduced to be about 3.0 µm and the thickness of the insulating layer 182 may be reduced to be about 1.5 µm, and the average of the light emitting area ratio may be about 96%. In a case that both thicknesses of the insulating layers 182 and 190 may be reduced, it may be possible to further suppress the light emitting area from being reduced than in a case where the thickness of only one of the insulating layers may be reduced. Thus, the volume of the insulating layer 182 and/or the insulating layer 190 may be reduced by forming the openings 80 and 92 and/or the grooves 91 in the insulating layer 182 and the insulating layer 190, respectively, thereby suppressing the outgassing and shrinkage of a light emitting area.

While the disclosure has been described in connection with the embodiments described herein, it is to be understood that the embodiments may not be limited by their provided descriptions, but, on the contrary, such embodiments and descriptions are intended to cover various modifications and equivalent arrangements included within the spirit and scope of the appended claims.

What is claimed is:

1. A display device, comprising:
a substrate;
a transistor disposed on the substrate, the transistor including an active layer, a gate electrode, a source electrode, and a drain electrode;
a first insulating layer disposed on the transistor and directly contacting an upper surface of at least one of the source electrode and the drain electrode of the transistor;
a second insulating layer disposed on and directly contacting the first insulating layer, the second insulating layer being of integral single-piece construction;
a first pixel electrode and a second pixel electrode disposed on the second insulating layer to be adjacent to each other; and
a third insulating layer disposed on the second insulating layer, a portion of the third insulating layer disposed above a top surface of the first pixel electrode and the second pixel electrode, wherein
the second insulating layer includes a first opening disposed between the first pixel electrode and the second pixel electrode,
the first insulating layer includes a portion that completely overlaps the first opening,
the third insulating layer includes a portion that directly contacts the first insulating layer, and
the third insulating layer includes a groove or an opening that overlaps the first opening.

2. The display device of claim 1, wherein
the first pixel electrode does not overlap the first opening, and
the second pixel electrode does not overlap the first opening.

3. The display device of claim 1, wherein
the second insulating layer includes a contact hole that overlaps the electrode of the transistor, and
the first opening is spaced apart from the contact hole.

4. The display device of claim 1, wherein the second insulating layer includes an organic insulating material.

5. The display device of claim 1, wherein the first opening is around a periphery of at least one of the first pixel electrode and the second pixel electrode.

6. The display device of claim 1, further comprising
a third pixel electrode disposed on the second insulating layer to be adjacent to the first pixel electrode and the second pixel electrode,
wherein the first opening is disposed outside of an area between the first pixel electrode and the third pixel electrode.

7. The display device of claim 6, wherein the second insulating layer is disposed continuously on the first pixel electrode and the third pixel electrode, in a plan view.

8. The display device of claim 1, wherein the third insulating layer includes an opening that overlaps the first pixel electrode.

9. The display device of claim 8, wherein the third insulating layer includes an opening that overlaps the second pixel electrode.

10. The display device of claim 9, further comprising:
a first emission member disposed on the first pixel electrode;
a second emission member disposed on the second pixel electrode; and
a common electrode disposed on the first and second emission members, wherein
at least one of the first emission member and the second emission member is spaced apart from the first opening, and
the common electrode includes a portion that contacts the first insulating layer through the opening that overlaps the first opening.

11. A display device, comprising:
a substrate;
a transistor disposed on the substrate, the transistor including an active layer, a gate electrode, a source electrode, and a drain electrode;
a first insulating layer disposed on the transistor and directly contacting an upper surface of at least one of the source electrode and the drain electrode of the transistor;
a second insulating layer disposed on and directly contacting the first insulating layer, the second insulating layer being of integral single-piece construction;
a first light emitting diode and a second light emitting diode disposed on the second insulating layer to be adjacent to each other; and
a third insulating layer disposed on the second insulating layer, a portion of the third insulating layer disposed above a top surface of a pixel electrode of both the first light emitting diode and the second light emitting diode, wherein the second insulating layer includes a first opening disposed between a first emission member of the first light emitting diode and a second emission member of the second light emitting diode, the first insulating layer includes a portion that overlaps the first opening so as to form a bottommost surface of the first opening, the third insulating layer includes a portion that directly contacts the first insulating layer at the bottommost surface of the first opening, and the third insulating layer includes a groove or an opening that overlaps the first opening.

12. The display device of claim 11, wherein the first insulating layer and the second insulating layer each include a contact hole that overlaps the electrode of the transistor, and the first opening is spaced apart from the contact holes.

13. The display device of claim 12, wherein the first light emitting diode includes:

a first electrode disposed on the second insulating layer; and a second electrode disposed on the first emission member, wherein the first electrode is connected to the electrode of the transistor through the contact holes.

14. The display device of claim 13, wherein the first electrode does not overlap the first opening.

15. The display device of claim 13, wherein the first opening is around a periphery of the first electrode.

16. The display device of claim 11, further comprising a third light emitting diode disposed on the second insulating layer to be adjacent to the first light emitting diode and the second light emitting diode, wherein the third light emitting diode includes a third emission member, and the first opening is disposed outside of an area between the first emission member and the third emission member.

17. The display device of claim 16, wherein the second insulating layer is disposed continuously on the first emission member and the third emission member, in a plan view.

18. The display device of claim 11, wherein the third insulating layer directly contacts an upper surface of the first insulating layer at a location spaced apart from the second insulating layer in the first opening.

19. The display device of claim 11, wherein the third insulating layer directly contacts both the first insulating layer and the second insulating layer in the first opening.

20. A display device, comprising:

a substrate;

a transistor disposed on the substrate;

a first insulating layer disposed on the transistor;

a second insulating layer disposed on and directly contacting the first insulating layer;

a first light emitting diode and a second light emitting diode disposed on the second insulating layer to be adjacent to each other; and a third insulating layer disposed on the second insulating layer, a portion of the third insulating layer disposed above a top surface of a pixel electrode of both the first light emitting diode and the second light emitting diode, wherein the second insulating layer includes a first opening disposed between a first emission member of the first light emitting diode and a second emission member of the second light emitting diode, the first insulating layer includes a portion that overlaps the first opening so as to form a bottommost surface of the first opening, the third insulating layer includes a portion that directly contacts the first insulating layer at the bottommost surface of the first opening, the third insulating layer includes a groove or an opening that overlaps the first opening, and the first opening being a single, continuous hole that completely surrounds the first emission member or the second emission member, and at least one of the first emission member and the second emission member is spaced apart from the first opening.

* * * * *